April 23, 1968 K. E. BEAN ET AL 3,379,584

SEMICONDUCTOR WAFER WITH AT LEAST ONE EPITAXIAL LAYER AND METHODS OF MAKING SAME

Filed Sept. 4, 1964 3 Sheets-Sheet 1

INVENTOR
KENNETH E. BEAN
WALTER R. RUNYAN

BY William D. Harris, Jr.

ATTORNEY

INVENTOR
KENNETH E. BEAN
WALTER R. RUNYAN

BY William L. Harris, Jr.

ATTORNEY

April 23, 1968 K. E. BEAN ET AL 3,379,584

SEMICONDUCTOR WAFER WITH AT LEAST ONE EPITAXIAL LAYER AND METHODS OF MAKING SAME

Filed Sept. 4, 1964 3 Sheets-Sheet 3

INVENTOR
KENNETH E. BEAN
WALTER R. RUNYAN

BY William D. Hanes, Jr.

ATTORNEY

United States Patent Office 3,379,584
Patented Apr. 23, 1968

3,379,584

SEMICONDUCTOR WAFER WITH AT LEAST ONE EPITAXIAL LAYER AND METHODS OF MAKING SAME

Kenneth E. Bean, Richardson, and Walter R. Runyan, Dallas, Tex., assignors to Texas Instruments, Incorporated, Dallas, Tex., a corporation of Delaware Filed Sept. 4, 1964, Ser. No. 394,408
22 Claims. (Cl. 148—175)

ABSTRACT OF THE DISCLOSURE

Disclosed is a method of aligning regions in epitaxial material deposited on a semiconductor substrate by forming the epitaxial layer on a patterned face of the substrate cut at an angle of between 0.5 and 10° from the (111) plane.

This invention relates to a semiconductor wafer with at least one epitaxial layer and to methods of making same. More specifically, but without limitation, it relates to such a wafer that has an epitaxial layer formed on a substrate surface which is oriented at a small angle from the (111) plane, which permits alignment of upper regions or structure of the wafer in accordance with an underlying pattern on the substrate.

The technique of epitaxial deposition, whereby overlying layers may be grown on a crystalline substrate, is known in the art. By such epitaxial technique (epitaxy), like material is joined to a substrate to form a product that is essentially monocrystalline in nature. Epitaxy makes it possible to produce many devices which may not be produced in quality by other techniques. Moreover, in certain cases epitaxy offers a much more reliable and inexpensive technique for production of high quality devices than may be obtained by other known techniques of fabrication.

It is desirable to provide a device having more than one epitaxial layer in some instances. However, in the prior art, the proper alignment of various necessary regions, zones or structures within the device has presented a problem.

An object of the present invention is to provide a technique for the precise formation at desired locations of various regions, zones or structures in successive layers of a wafer in which a semiconductor device is formed; for example, the precise formation of various zones or regions in a substrate and in one or more successive layers overlying the substrate. A further object is to provide a method of forming a wafer in which an epitaxial layer with a desired visible pattern is produced. Yet another object is to provide a method for producing a semiconductor integrated circuit having successive epitaxial layers with aligned regions therein and in the substrate. It is an additional object to provide means for growing an epitaxial layer at lower temperatures and/or on substrates of poorer quality than is ordinarily possible.

In accordance with the present invention, a process is provided for making a monocrystalline wafer. This process comprises the steps of preparing a monocrystalline substrate with a face thereon cut at least about 0.5° and no greater than about 10° with the (111) plane and epitaxially depositing a layer of material on the face of the substrate.

In a more specific aspect the process comprises making a monocrystalline wafer by preparing a monocrystalline substrate with a face thereon cut at least about 0.5° and no greater than on the order of about 10° with the (111) plane; forming a visible pattern in the surface of the face of the substrate; epitaxially depositing a layer of material on the face over the pattern; and positioning structure over the epitaxially-deposited layer in a substantially precise location with respect to the pattern. It should be noted that the epitaxially-deposited layer maintains the integrity and visibility of the pattern originally formed in the surface of the face of the substrate. It is preferred that the angle at which the face is cut be between about 1° and 3° with the (111) plane. It is further preferred that the monocrystalline substrate be silicon, but other semiconductor materials, preferably those of cubic crystal structure, may be effectively used, e.g., germanium, gallium arsenide, and indium antimonide.

In a specific preferred embodiment of the present invention, the process further comprises forming diffusion regions in the initial epitaxial layer in substantially precise locations with respect to the visible pattern. Thereafter, the steps may be repeated to form an additional epitaxial layer, or layers, having diffusion regions in substantially precise locations with respect to the visible pattern.

In accordance with the structural aspects of the present invention, a monocrystalline wafer for a solid integrated network is provided. The wafer includes a substrate of substantially monocrystalline semiconductor materials, a first substantially monocrystalline epitaxial layer overlying the first epitaxial layer, and a deep diffusion region running through the first and second epitaxial layers and into the substrate.

In a specific preferred embodiment, the structure referred to in the foregoing paragraph is such that the deep diffusion region is configured to provide isolation zones adjacent the surface of the wafer. The substrate is of a P conductivity-type material, the first epitaxial layer of an N+ type material, the second epitaxial layer of the N conductivity-type, and the deep diffusion region of heavily doped P+conductivity-type. Further, a pair of NPN transistors and a pair of resistors are formed in the isolation zones. These elements are disposed to define a solid NOR logic network.

For a more complete understanding of the present invention and for further objects and advantages thereof, reference may now be had to the following description taken in conjunction with the accompanying drawings in which.

Figure 1:
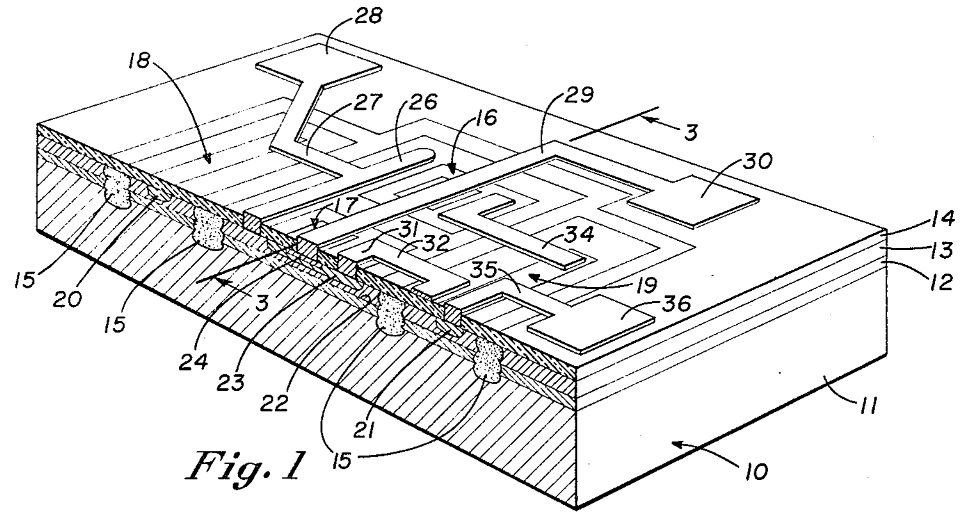
FIGURE 1 is a pictorial view in section of a semiconductor integrated circuit of the double epitaxy type which may be fabricated in accordance with the principles of this invention.
Figures 12, 13, 14, 15, 16, 17, 18:
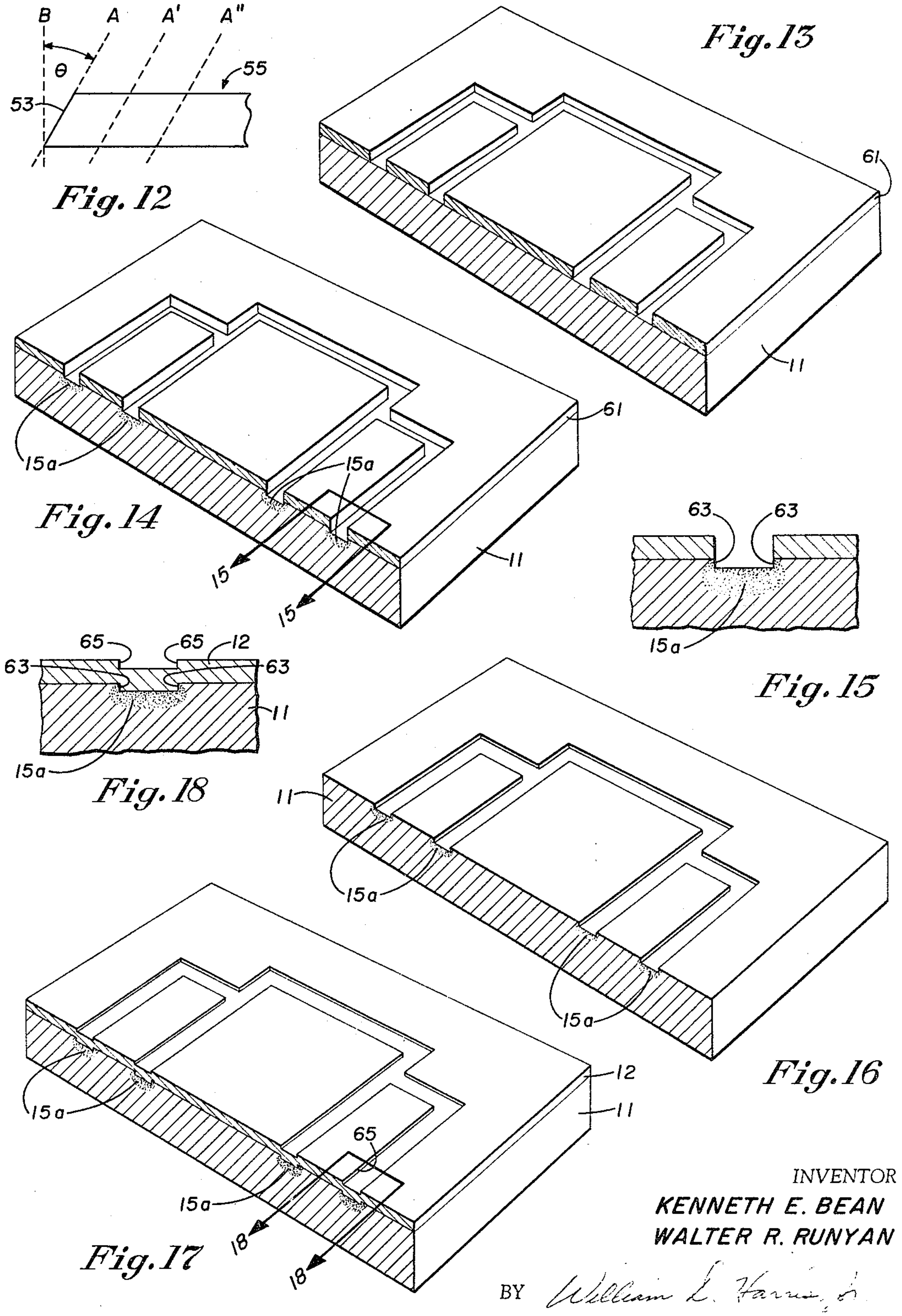
FIGURE 12 is a schematic view illustrating a method of preparation of a substrate having a face inclined at a critical angle $\theta$ with the (111) plane.
Figures 19, 20, 21, 22, 23:
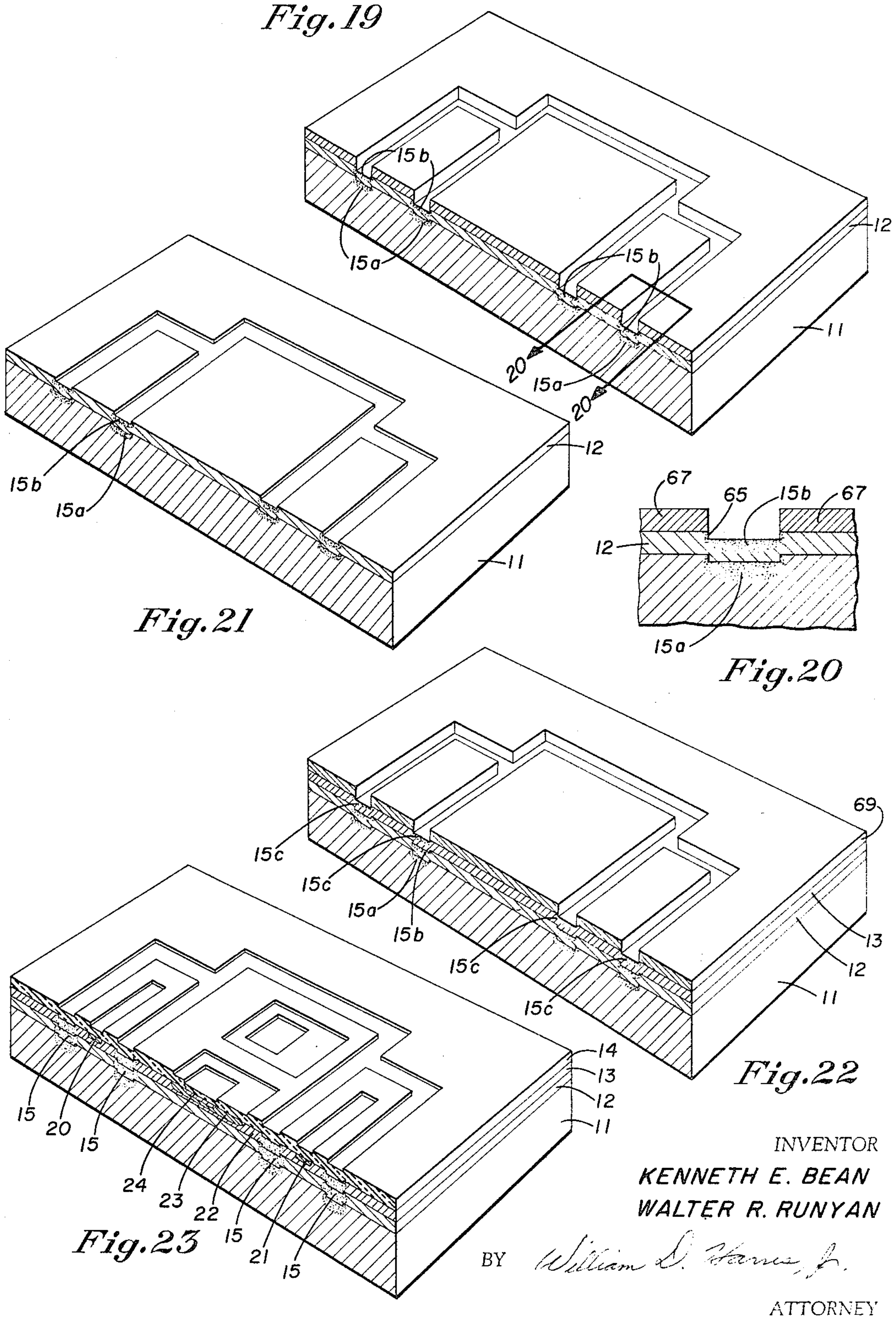

FIGURES 13, 14, 16, 17, 19 and 21–23 are sequential pictorial views in section, illustrating the steps of preparation of the structure of FIGURE 1; and FIGURES 15, 18 and 20 are partial sectional elevational views taken along 15—15, 18—18 and 20—20 of FIGURES 14, 17 and 19, respectively.

With reference to FIGURE 1, there is shown a semiconductor integrated circuit which is made in accordance with the epitaxial techniques of this invention. This integrated circuit includes a chip or wafer 10 of single crystal semiconductor material, typically silicon, with the wafer comprising a P conductivity-type substrate 11 upon which there is grown a first N+ epitaxial layer 12 and a second N conductivity-type epitaxial layer 13. Overlying the top layer 13 is a coating 14 of silicon dioxide which is formed during the final diffusion operations. A pattern or grid of heavily-doped P+ conductivity-type isolation regions 15 extend through the N conductivity-type epitaxial layers 12 and 13 in to the substrate 11 to create isolated zones of N conductivity-type semiconductor material adjacent the top surface of the wafer 10. In these isolated N conductivity-type zones are formed the active and passive circuit elements which provide the integrated circuit. In the device of FIGURE 1, which embodies the NOR logic circuit of FIGURE 2, the central region has formed therein a pair of NPN transistors 16 and 17 which have a common collector region 22. Also, a pair of resistors 18 and 19 are provided by elongated diffused P conductivity-type regions 20 and 21, respectively, formed in the N conductivity-type layer 13. The transistor 17 includes a collector region 22 which is part of the lightly-doped N-conductivity-type epitaxial material of the layer 13, and further includes a planar-diffused P conductivity-type base region 23, and an N conductivity-type planar-diffused emitter region 24. These base and emitter regions are formed by well-known diffusion techniques including forming an oxide coating, using photoresist operations for selective removal of the oxide, diffusion from an impurity-entrained vapor while creating another layer of oxide, followed by repetition of these steps as necessary. It should be noted that the resistors 18 and 19 are created by the same P conductivity-type diffusion operation which forms the base 23. The transistor 16 is exactly like the transistor 17, which may be seen in section. Connection to the common collector region 22 for the two transistors is provided by an elongated metal contact 26 which is deposited in a hole etched in the oxide layer 14. Deposited metal 27 extending from the contact 26 over the oxide 14 makes a connection to one end of the resistor 18 while a further extension of the deposited metal 27 forms a land 28 on top of the oxide 14 to facilitate making a connection to the output of the circuit. Another conductive interconnection 29, seen in FIGURE 3, overlies the oxide 14 but extends therethrough to the emitters of each of the transistors 16 and 17 so that these emitters are elecrically connected together and also connected to a land 30 which provides the negative bias terminal for the integrated circuit. A base contact 31 on the base 23 of the transistor 17 is connected by a deposited metal strip 32 overlying the oxide 14 to the end of a resistor 33 (not shown except in FIGURE 2), with the other end of this resistor being connected to a land which provides one of the input terminals to the integrated circuit. The base of the transistor 16 is connected in a similar manner by deposited metal 34 to one end of the resistor 19 while the other end of this resistor is connected by a deposited metal strip 35 to a land 36 which provides the other input to this gate circuit.

The semiconductor integrated circuit described thus far makes use of several features which require the fabrication procedure of this invention as will be described hereinafter. One of these features is the heavily-doped buried N+ region 12. This buried highly-conductive epitaxial layer 12 is needed to facilitate making low resistance connection to the collector region of the transistors. The actual operating collector region of the transistor should be of lightly-doped, high resistance N conductivity-type material so that the switching speed of the transistor is high and the back breakdown voltage of the collector-base junction is also high. This condition, however, makes the resistance from the collecting region of the transistor, i.e., that resistance immediately underlying the part of the base 23 which is underneath the emitter 24, to the collector contact 26 high unless some provision is made. If this resistance is high, it means that the collector saturation resistance of the transistor in the circuit is undesirably high. The resistance from the collecting region of the transistors to the collector contact 26 is lowered by means of the low resistance, heavily-doped epitaxial N+ conductivity-type region 12 which is in parallel electrically with the high resistance N— conductivity-type region 22. It should be noted that the vertical dimension of the FIGURE 1 embodiment is greatly exaggerated so that in reality the distance from the contact 26 to the heavily-doped layer 12 is very, very small compared to the distance from the contact 26 to the collecting region. Another feature which the integrated circuit described above utilizes is the isolation regions 15 formed by a plurality of diffusion operations performed before the top epitaxial region is grown. This technique avoids the necessity of prolonged diffusion operations such as would be necessary if an attempt was made to create the entire regions 15 by a single diffusion from the top surface after all of the epitaxial regions had been grown. In the latter case, it would be very difficult to convert the heavily-doped N+ region 12 to P conductivity-type and also the lateral extension of the isolation diffusion regions might be excessive. It is for these reasons that the isolation diffusions are performed early in the process, one or more of these diffusions being buried underneath the epitaxial layers.

To appreciate the criticality of the precise alignment necessary for making the successive isolation diffusions, the extreme small size of the device described above should be noted. The chip 10 may itself be only perhaps 30 or 40 mils square, meaning that it would be barely discernible to the naked eye at arm's length. The width of the isolation regions 15 may be only one or two mils, meaning that a very slight misalignment of the mask for the successive diffusion operations, making the diffusions fail to overlap, would result in the device being useless. Actually the chip 10 is cut from a slice of single crystal silicon which would be perhaps one inch in diameter. A larger number of the integrated circuits of FIGURE 1 would be formed simultaneously on a slice, perhaps 50 to 100 of these circuits being formed at one time, after which the slice would be scribed and broken into individual integrated circuits as seen in FIGURE 1.

To facilitate an understanding of the present invention and the problem solved by it, the preparation of a unitary monocrystalline multilayer wafer of silicon having a simple single diffusion region therein will now be described. The preparation is sequentially illustrated in FIGURES 4 through 10.

Figures 2, 3, 4, 5, 6, 7, 8, 9, 10, 11:
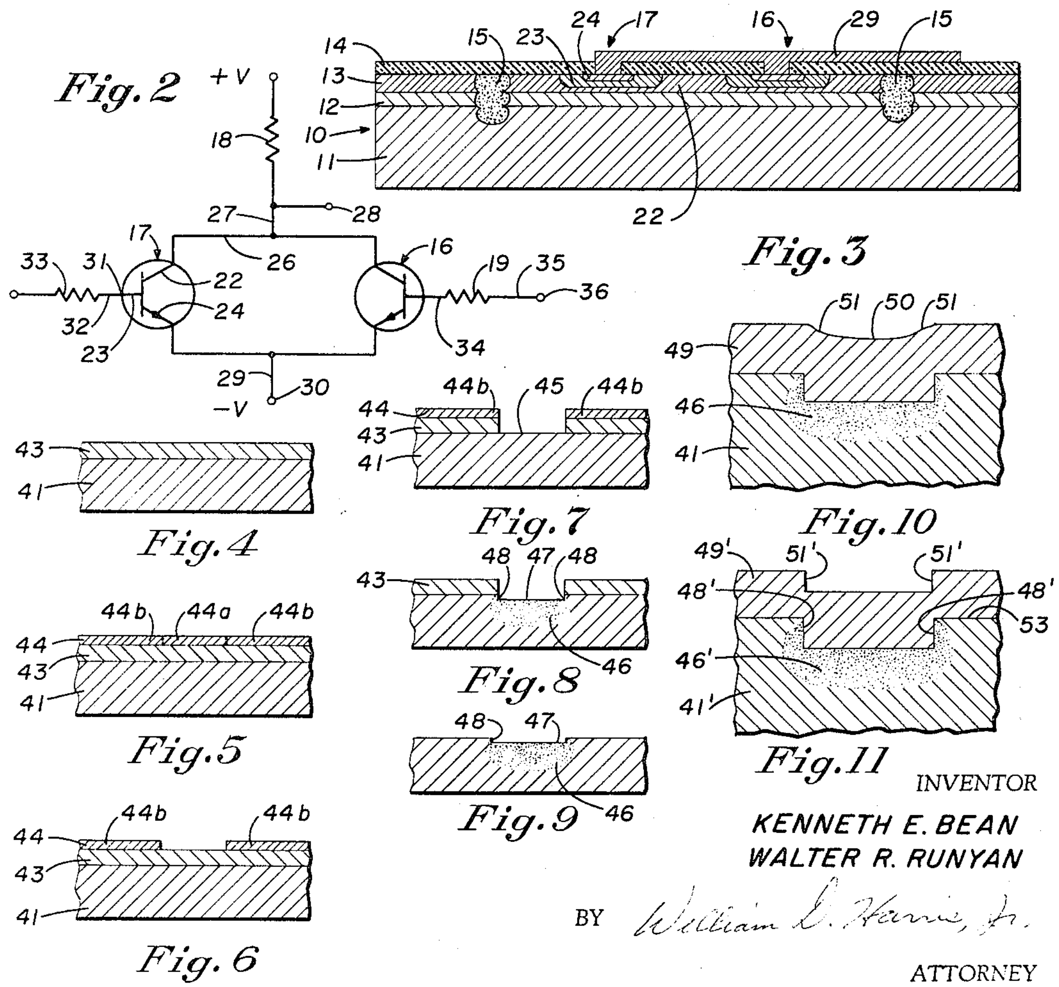
FIGURE 2 is a schematic diagram of the NOR logic circuit embodied in the device of FIGURE 1.
FIGURE 3 is an elevational view in section taken along the lines 3—3 in FIGURE 1.
FIGURES 4 through 10 are schematic sectional views in elevation illustrating sequential steps in forming a wafer having a single epitaxial layer overlying a substrate with a single simple diffusion region in it.
FIGURE 11 is an analogous view to FIGURE 10 and illustrates structure formed by the same steps as used in forming the structure of FIGURE 10, except that the substrate face is prepared to lie at a critical angle with the (111) plane, in accordance with the present invention.

Referring to FIGURE 4, a substrate 41 (e.g., a slice of substantially monocrystalline silicon) has a thin layer 43 of silicon dioxide on its upper surface. This layer 43 is formed, for example, by depositing the silicon dioxide on the surface of the layer through reaction of silicon tetrachloride gas and carbon dioxide at a temperature of about 1200° C. for a reaction period of on the order of about five minutes. Alternatively, the surface portion of the substrate may be thermally oxidized by passing steam and oxygen over it in a reactor at about 1200° C. for a suitable period until an oxidation layer of desired thickness forms. The thickness of the silicon dioxide layer 43 may vary, but typically it is on the order of about 10,000 Angstroms.

The silicon dioxide layer 43 of substrate 41 next has a thin photosensitive film 44 of a photoresist solution applied to its upper surface. The precise chemical formula of this solution is not available to the public, but the solution may be obtained from Eastman Kodak Company under the designation "KMER" (Kodak Metal Etch Resist). Ultra-violet light is then selectively applied to the top of the thin film 44 to expose preselected regions in accordance with a desired pattern. For example, a glass mask having blacked-out areas thereon, so that light is transmitted only through the desired pattern, may be used to cover the film 44 while ultra-violet light is impinged on the glass mask. It will be apparent that exposed and non-exposed regions will result in the photoresistant film 44. FIGURE 5 schematically illustrates the resulting appearance of the in-process work at this time, with the film 44 having exposed regions **44*b* and the non-exposed region 44*a***. The boundary between these regions is indicated schematically in FIGURE 5 by dotted lines.

The structure of FIGURE 5 is next treated with non-exposed photoresist solvent (a light chloronated hydrocarbon solvent, e.g. trichloroethylene and others available through Eastman Kodak Company). The appearance of the in-process work after treatment with the non-exposed photoresist solvent is shown in FIGURE 6, wherein it will be seen that the non-exposed region **44*a* of film 44 has been removed. Note that silicon dioxide layer 43 is bared in the region on which the removed non-exposed film region 44*a*** previously rested.

The work product from FIGURE 6 is next etched with a concentrated solution of hydrofluoric acid, as is well-known in the art, to remove the silicon dioxide layer in the area in which it is not protected by the exposed photoresist film **44*b*. The appearance of the in-process work after the etch step of FIGURE 6 is illustrated in FIGURE 7 wherein it will be noted that a central channel is defined which has as its bottom the surface area 45 of the silicon substrate 41** which was bared by the etch removal of silicon dioxide film.

Thereafter, exposed photoresist solvent (for example, a hot mixture of sulfuric acid and nitric acid) is used to remove the exposed photoresist film regions **44*b*. The in-process work is deposited in a furnace and a dopant (for example, boron) is deposited on the exposed upper surface of silicon substrate 41 and thereafter diffused into the silicon to define the diffused region 46**. The boron deposition and diffusion step may be conducted by depositing the boron from boron tetrabromide and oxygen at about 1000° C., followed by a diffusion step at a temperature of about 1200° C., preferably conducted in dry oxygen for several hours.

At this point, the in-process work appears as is illustrated in FIGURE 8, which illustrates the diffused region 46. Attention is directed to the channel or depression 47, with its sides or shoulders 48, which define a sharp visible pattern on the upper face of the silicon substrate 41. This pattern results from a change in the level of the silicon surface resulting from oxidation during the diffusion step. Accordingly, a very thin layer of silicon dioxide (omitted from FIGURE 7, and other analogous figures herein, for clarity) overlies the pattern so produced. This thin layer is removed along with the silicon dioxide layer 43 by immersing the product so illustrated in FIGURE 8 in hydrofluoric acid solution. The appearance of the resulting product is illustrated in FIGURE 9.

The product of FIGURE 9 is now ready for the deposition of additional monocrystalline silicon on its upper surface. For example, with the diffusion region 46 being of the P+type, the epitaxial deposition might be conducted to apply an N+ heavily-doped silicon layer from silicon tetrachloride and hydrogen gases carrying a small quantity of antimony tetrachloride or other suitable N conductivity-type dopant. Such epitaxial deposition may be conducted at an elevated temperature, for example, about 1250° C. Various techniques of epitaxial deposition may be employed, including those explained in "Epitaxial Silicon Films by Hydrogen Reduction of $SiCl_4$," Theuerer, Electrochemical Society, vol. 108, pp. 649–653, (1961), and in U.S. Patent 2,692,839 (referring specifically to germanium, but also applicable to silicon at higher temperatures).

FIGURE 10 is a partial sectional view illustrating the portion of substrate 41 which carries the diffusion region 46 and an immediately overlying epitaxially-deposited layer 49. Note that a depression or channel 50, having side or shoulder portions 51, is present on the upper surface of the epitaxially-deposited layer 49. That shoulders 51 of channel 50, as illustrated in FIGURE 10, slope substantially and do not provide a well-defined indication of the precise location of the underlying diffusion region 46. The pattern on the upper surface of the epitaxial layer 49 is thus not sharp and is not generally reliable as a means of locating the diffusion region 46 for subsequent operations. Accordingly, great difficulty is presented if it is desired to locate an additional mask and perform subsequent diffusions precisely located with respect to region 46.

In accordance with the present invention, the problem illustrated in FIGURE 10 and discussed in the preceding paragraph is solved by an initial preparation step in which a silicon substrate is prepared by cutting its upper face 53 at a small angle, ranging from no less than about 0.5° to no more than about 10° with the (111) plane [the designation (111) being the Miller indices, as is known in the art]. Referring to FIGURE 12, a portion of an elongated crystal grown along the (111) plane is illustrated as 55. For preparation of slices suitable for practice of the present invention, substrates are formed from the crystal by cutting along a plane at a small angle $\theta$ with the (111) plane. The angle $\theta$ ranges from about 0.5° to the order of about 10°, preferably from about 1° to 3°. Accordingly, crystal substrates are produced which have faces such as 53 inclined at the angle $\theta$ with the (111) plane. The trace of the cutting plane is illustrated in FIGURE 12, along the dotted line designated A, and the trace of the (111) plane is shown along the dotted line B. The angle between them is exaggerated in FIGURE 12 for clarity of illustration. Successive slices may be cut from crystal 55 along spaced apart planes such as A′ and A″, which are parallel to the face 53.

Referring to FIGURE 11, the substrate 41′ is analogous to substrate 41 (FIGURES 4–10) except that its upper face 53 is at a small angle, e.g., about 1.5°, with the (111) plane. The substrate 41′ has had all of the operations performed on it that were performed on substrate 41 at the state illustrated in FIGURE 10. However, a material difference can be seen between the structures of FIGURE 10 and FIGURE 11. The shoulders 51′ in the epitaxial layer 49′ of FIGURE 11 are sharp, contrasted to the sloping shoulders 51 in the epitaxial layer 49 of FIGURE 10. These sharp shoulders 51′ rather precisely overlie the shoulders 48′ in the substrate 41′. Consequently, a quite sharp pattern is produced on the upper surface of epitaxial layer 49′. The presence of this sharp pattern makes it possible to quite precisely locate, with respect to diffusion region 46′ in substrate 41′, a mask or other desired item for subsequent processing or treatment. For example, an additional diffusion region may now be formed in epitaxial layer 49′ by the same techniques with which region 46′ was formed in silicon wafer 41. Such a diffusion region may be made to overlie diffusion region 46′, if desired. In the alternative, diffusion regions may be formed at locations spaced at desired predetermined distances from diffusion region 46′. If a diffusion region is formed which directly overlies the diffusion region 46′, further diffusion may be accomplished to cause the diffusion regions initially present to merge with it, if desired. Further detail on this procedure will be explained at a later point hereinafter.

The making of a semiconductor integrated circuit of the double-epitaxy type having the structure previously described in connection with the FIGURES 1–3, will now be explained. The various operations will be summarized briefly in view of their direct analogy to the operation explained above in connection with FIGURES 1 through 12.

FIGURE 13 illustrates the P conductivity-type silicon substrate 11 with its upper surface or face cut at a small angle from the (111) plane, for example, 2°. Preparation of the substrate 11 may be accomplished, for example, by cutting the substrate from an elongated silicon crystal which was grown on the (111) plane. Such cutting takes place along a plane misaligned 2° from the (111) plane. The cutting operation may be accomplished by various means, for example, by cutting with a diamond saw positioned rather precisely along the desired cutting plane while the (111) grown crystal is firmly supported. The face of P conductivity-type substrate 11 is covered by the silicon dioxide layer 61. The silicon dioxide layer 61 is channeled to expose preselected upper areas of the face of substrate 11. The technique of forming the oxide layer and selectively removing desired portions of it was previously described herein in connection with FIGURES 4–8.

Heavily-doped P conductivity-type diffusion regions 15*a* are next formed in the product of FIGURE 13. The diffusion technique described in connection with FIGURE 8 may be employed for this purpose. The resulting product is illustrated in FIGURE 14. FIGURE 15 is a partial section showing an enlarged view, including a diffusion region 15*a*, illustrating the shoulders 63 which overlie and define the opposite sides of the illustrated diffusion region 15*a*.

FIGURE 16 illustrates the appearance of the product of FIGURE 14 after the oxide layer 61 is removed, e.g., with hydrofluoric acid. Thereafter, an N+ epitaxial layer is deposited in the manner described in connection with FIGURE 11, e.g., by deposition of silicon from a mixture of silicon tetrachloride and hydrogen gases containing heavy dopant quantities of antimony pentachloride therein. The resulting epitaxial layer 12 (FIGURE 17) has a sharp pattern on its face. This pattern is clearly defined by the sharp shoulders 65, which substantially directly overlie shoulders 63 on the substrate 11 (see the partial sectional view of FIGURE 18).

Thereafter, the process of forming an oxide film, selectively removing desired portions of it, and diffusing impurities into the epitaxial layer 12 is repeated to form P conductivity-type regions 15*b* which directly overlie the P conductivity-type region 15*a* in substrate 11 (FIGURES 19 and 20). Note that the precise alignment necessary for forming region 15*b* over 15*a* was made possible by the sharp, visible pattern on the oxide layer 67 which was formed on top of the epitaxial layer 12. This oxide layer retains the integrity of the sharp pattern of the epitaxial layer 12 on which it is formed. Accordingly, shoulders in the oxide layer directly overlying the shoulders 65 in the epitaxial layer 12 provide the pattern by which to align the mask on a film of photoresist applied over the oxide. In this connection, bear in mind that the photoresist film is transparent and, accordingly, visual alignment is possible. Thus, the glass mask previously used to prepare the pattern for diffusion regions 15*a* is again used, this time precisely visually aligned to lie directly over the diffusion regions 15*a*. After exposure to ultra-violet light, removal of non-exposed photoresist, and etching, boron diffusion is repeated. The resulting product, with diffusion regions 15*b* lying directly above diffusion regions 15*a*, is illustrated in FIGURES 19 and 20. FIGURE 21 illustrates the resulting product after removal of the oxide layer 67.

Referring to FIGURE 22, an additional epitaxial layer 13, having diffusion regions 15*c* precisely aligned to lie directly over diffusion regions 15*a* and 15*b*, is illustrated. The same technique used in connection with preparation of epitaxial layer 12 and diffusion regions 15*b* is used to prepare this epitaxial layer 13 with its diffusion regions 15*c*. Note that the alignment was made possible by the retention of the sharp pattern on the face of the second epitaxial layer (i.e., layer 13). An oxide coating 69 overlies the second epitaxial layer 13. This oxide layer is formed by the techniques previously described.

The structure of FIGURE 22 is thus seen to comprise the precisely aligned overlying diffusion regions 15*a*, 15*b* and 15*c*. When it is desired that these regions effectively merge into a single heavily-doped P+ conductivity-type isolation region 15, as is the case in the present structure, the merger may be accomplished by placing the structure of FIGURE 22 in a furnace at a temperature of 1200° C. for 12 hours to allow the P+ conductivity-type regions 15*a*, 15*b* and 15*c* to diffuse together to clearly define the single, deep isolation region 15.

After the formation of deep isolation region 15 (illustrated in FIGURE 23) subsequent techniques well-known in the art are utilized to form the P conductivity-type regions 20 and 21, the P conductivity-type planar-diffused base region 23, and the N conductivity-type planar-diffused emitter region 24. FIGURE 23 illustrates the structure after these diffusions have been conducted. Note that the final oxide layer or coating 14 is in place at this point in the processing.

In view of the remarks made previously herein, it will be apparent that the structure of FIGURES 1 and 2 is readily prepared from the structure of FIGURE 23.

EXAMPLE

The procedure described in connection with preparing the structure of FIGURE 1 was followed in six successive attempts to make the wafer 10 of FIGURE 1. The respective substrates used in the efforts were cut with faces at the following maximum angles with the (111) plane:

(*a*) 0°, (*b*) −5 minutes, (*c*) +13 minutes, (*d*) −39 minutes, (*e*) +1.5°, (*f*) −2.75°.

The efforts produced visible patterns for the −39 minutes, +1.5°, and −2.75° faces. The pattern formed on the −39 minutes face was moderately sharp, sufficiently so to make subsequent fabrication possible. The patterns on the −2.75 and +1.5 faces were quite sharp, making subseqeunt fabrication procedure of quality wafers straightforward. Quite poor patterns were produced with the substrates having faces cut at 0°, −5 minutes, and +13 minutes, in fact, so poor that fabrication of the wafer 10 in proper alignment was not possible.

It should be noted that the direction of the angle of misalignment from the (111) plane, in accordance with this invention, does not appear to matter. It only appears important that the proper misalignment exist.

In accordance with the foregoing description of this invention, it is seen that the invention permits deposition of an epitaxial layer, yet provides for precise alignment with respect to underlying diffusion regions or other patterns on the substrate. Moreover, it is seen that successive alignment is provided for a multiplicity of epitaxial layers in which zones or regions of diffusion may be located precisely with respect to zones or regions in successively formed layers, even though the first formed regions are located in lower layers. Moreover, it is seen that provision is made for forming a deep isolation region extending through one epitaxial layer, or more, to a substrate by which individually formed regions in each may be precisely aligned and connected by subsequent diffusions to form precisely-aligned, deep, relatively uniformly-doped regions. Such deep regions may be utilized, for example, as isolation zones.

The preferred angle of the face of the substrate with the (111) plane is between about 1° and 3° and should not be less than about 0.5° nor greater than on the order of about 10°.

It has been noted that epitaxial growth on substrate faces cut at a small angle with the (111) plane has been possible at somewhat lower temperatures and on somewhat poorer substrates than when the plane on which epitaxial deposition is conducted is not inclined a small angle with the (111) plane. The small critical angle is that referred to above, i.e., from about 0.5° to on the order of about 10°.

The plane of the substrate on which epitaxial deposition is to be conducted may be prepared by a variety of means, e.g., by sawing, lapping, or abrading. Such means of preparation are generically referred to herein as "cutting." Accordingly, it is understood that the words "cut" and "cutting" are used in the claims hereof in a broad sense, i.e., the separating and/or removal of material by any effective means whatsoever.

In the practice of this invention, silicon is preferred as the semiconductor material of construction for the substrate and overlying epitaxial layers; however, other semiconductor materials may be employed. Particularly, the present invention is found most effective when semiconductor materials have cubic crystal structure, such as (but without limitation) silicon, germanium, gallium arsenide, and indium antimonide.

It should be appreciated that the present invention is not limited to forming visible patterns on a substrate by the diffusion-oxide removal techniques described. Other techniques of visible pattern formation may be used, for example, etch techniques or selective oxidation techniques conducted to form a desired, predetermined pattern.

Having described the invention in connection with certain specific embodiments thereof, it is to be understood that further modifications may now suggest themselves to those skilled in the art and it is intended to cover such modifications as fall within the scope of the appended claims.

What is claimed is:

1. A process for aligning an upper region of a semiconductor wafer with an underlying pattern comprising the steps of: preparing a monocrystalline substrate with a face thereon cut at least about 0.5° and no greater than on the order of about 10° from the (111) plane, forming a sharp visible pattern of discontinuities on the face of said substrate and epitaxially depositing a layer of material on said face over said pattern such that a similar sharp visible pattern of discontinuities is formed on the epitaxial layer overlying the pattern on said substrate.

2. The process of claim 1 in which said monocrystalline substrate is a semiconductor material of cubic type crystal structure.

3. A process of aligning an upper region of a semiconductor wafer with an underlying pattern comprising the steps of: preparing a monocrystalline substrate with a face thereon cut at least about 0.5° and no greater than on the order of about 10° from the (111) plane, forming a sharp visible pattern of discontinuities on the face of said substrate, epitaxially depositing a layer of material on said face over said pattern such that a similar sharp visible pattern of discontinuities is formed on the epitaxial layer overlying the pattern on said substrate, and positioning structure on the epitaxial layer in a substantially precise location with respect to said pattern on said epitaxial layer.

4. The process of claim 3 in which said face is cut at an angle of between about 1° and 3° with the (111) plane.

5. The process of claim 3 in which said monocrystalline substrate is a semiconductor material of cubic type crystal structure.

6. The process of claim 3 in which said monocrystalline substrate is of a material selected from the class consisting of silicon, germanium, gallium, arsenide, and indium antimonide.

7. The process of claim 5 in which said face is cut at an angle of between about 1° and 3° with the (111) plane.

8. The process of claim 6 in which said face is cut at an angle of between about 1° and 3° with the (111) plane.

9. The process of claim in 8 in which the said substrate is silicon.

10. The process of claim 3 wherein said step of positioning structure on the epitaxial layer comprises forming an insulating layer diffusion mask having apertures therein over said epitaxial layer in substantially precise location with respect to said pattern on said epitaxial layer and diffusing impurities into said epitaxial layer through said apertures thereby forming diffused regions in said epitaxial layer whereby said diffused regions are aligned with the underlying pattern on said substrate.

11. The process of claim 3 wherein said step of positioning structure on the epitaxial layer comprises epitaxially depositing a second layer of material on said epitaxial layer such that a similar sharp visible pattern of discontinuities is formed on the surface of said second layer overlying the pattern on said epitaxial layer, forming an insulating layer diffusion mask having apertures therein over said second layer in a substantially precise location with respect to the pattern on said second layer and diffusing impurities into said second layer through said apertures thereby forming diffused regions in said second layer whereby said diffused regions are aligned with the underlying pattern on said substrate.

12. The process of claim 3 wherein the step of forming a sharp visible pattern of discontinuities on the surface of said substrate comprises forming an insulating layer diffusion mask having apertures therein on said face, diffusing impurities into said face through said apertures thereby forming a diffusion pattern on said face, forming said insulating layer within said apertures, and removing the insulating layer of said face thereby removing some of the semiconductor material on said face to form said sharp visible pattern of discontinuities on the face of said substrate.

13. In the process of making a solid, integrated network circuit, the steps of:

(a) preparing a monocrystalline substrate with the face thereon cut at least about 0.5° and no greater than on the order of about 10° from the (111) plane, (b) forming a diffusion pattern on said face of said substrate under conditions oxidizing the semiconductor material and forming an oxide layer on said face, (c) removing the oxide layer thereby forming a sharp visible pattern of depressions on said face, (d) epitaxially depositing a layer of material on said face over at least a portion of said pattern such that a similar sharp visible pattern of depressions is formed on the surface of the epitaxial layer, (e) positioning protective means partially covering said epitaxial layer in precise locations with respect to the pattern on said epitaxial layer, and (f) forming diffused regions in said epitaxial layer in locations not covered by said protective means.

14. The process of claim 13 including steps (a) through (f) in which the face of said substrate is prepared in step (a) by cutting said body along a plane located at an angle of between about 1° and 3° with the (111) plane.

15. In the process of making a solid, integrated network circuit, the steps of:

(a) preparing a monocrystalline substrate with the face thereon cut at about 0.5° and no greater than on the order of about 10° from the (111) plane, (b) forming a diffusion pattern on said face of said substrate under conditions oxidizing the semiconductor material and forming an oxide layer on said face, (c) removing the oxide layer thereby forming a sharp visible pattern of depressions on said face, (d) epitaxially depositing a first layer of material on said face over at least a portion of said pattern such that a similar sharp visible pattern of depressions is formed on the surface of said first layer, (e) positioning protective means partially covering said first layer in precise locations with respect to the pattern on said first layer, (f) forming diffused regions in said first layer in locations not covered by said protective means, (g) epitaxially depositing a second layer of material on said first layer over at least portion of the pattern on said first layer such that a similar sharp visible pattern of depressions is formed on the surface of said second layer, (h) postioning protective means partially covering said second layer in precise locations with respect to the pattern on said second layer, and (i) forming diffused regions in said second layer in locations not covered by the protective means on said second layer.

16. The process of claim 15, including steps (a) through (i), in which the face of said substrate is prepared in step (a) by cutting said body along a plane located at an angle of between about 1° and 3° with the (111) plane and in which said substrate is of a semiconductor material having a cubic type crystal structure.

17. The process of claim 15, including steps (a) through (i), in which the face of said substrate is prepared in step (a) by cutting said body along a plane located at an angle of between about 1° and 3° with the (111) plane, in which said substrate is selected from the group consisting of silicon, germanium, gallium arsenide, and indium antimonide, and in which said first and second of material are selected from the same group.

18. The process of claim 17, including steps (a) through (i), in which the protective means are positioned in steps (e) and (f) so that diffusion regions are formed in steps (f) and (i) are aligned to substantially directly overlie diffusion regions formed in said substrate in step (b), and further comprising the step of heating the product of step (i) to cause said overlying diffusion regions and the region in said substrate to merge into a diffusion region running through said first and second layers and into said substrate.

19. The process of claim 17 in which said substrate is silicon.

20. The process of claim 17 in which said substrate is germanium.

21. The process of claim 17 in which said substrate is gallium arsenide.

22. The process of claim 17 in which said substrate is indium antimonide.

References Cited

UNITED STATES PATENTS

| | | | |
|---|---|---|---|
| 2,899,344 | 8/1959 | Atalla et al. | 148—186 X |
| 3,022,568 | 2/1962 | Nelson et al. | |
| 3,149,395 | 9/1964 | Bray et al. | 148—175 |
| 3,189,973 | 6/1965 | Edwards et al. | 148—175 |
| 3,200,001 | 8/1965 | Merkel et al. | 23—223.5 |
| 3,206,339 | 9/1965 | Thornton | 148—1.5 X |
| 3,225,416 | 12/1965 | Diebold | 148—1.5 X |
| 3,226,612 | 12/1965 | Haenichen | 148—186 X |
| 3,265,542 | 8/1966 | Hershon | 148—175 |
| 3,278,347 | 10/1966 | Topas | 148—175 X |

OTHER REFERENCES

IBM Technical Disclosure Bulletin, vol. 4, No. 10, March 1962, pp. 58 and 59.

Ingham et al., Article in Metallurgy of Elemental and Compound Semiconductors, Interscience Publishers AIME publication, Aug. 29–31, 1960, vol. 12, pp. 285–297.

HYLAND BIZOT, *Primary Examiner.*

DAVID L. RECK, *Examiner.*

N. F. MARKVA, P. WEINSTEIN, *Assistant Examiners.*